US010405454B2

(12) United States Patent
Ruberto et al.

(10) Patent No.: US 10,405,454 B2
(45) Date of Patent: *Sep. 3, 2019

(54) STACKABLE SWITCH COOLING SYSTEM

(71) Applicant: Dell Products L.P., Round Rock, TX (US)

(72) Inventors: Thomas Ruberto, Austin, TX (US); Craig Warren Phelps, Austin, TX (US); John Charles Donachy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 251 days.

This patent is subject to a terminal disclaimer.

(21) Appl. No.: 15/426,766

(22) Filed: Feb. 7, 2017

(65) Prior Publication Data

US 2017/0150641 A1    May 25, 2017

Related U.S. Application Data

(63) Continuation of application No. 14/597,939, filed on Jan. 15, 2015, now Pat. No. 9,596,772.

(51) Int. Cl.
*H05K 5/00* (2006.01)
*H05K 7/20* (2006.01)
*G06F 1/20* (2006.01)

(52) U.S. Cl.
CPC .......... *H05K 7/20127* (2013.01); *G06F 1/20* (2013.01); *H05K 5/0021* (2013.01); *H05K 7/20445* (2013.01)

(58) Field of Classification Search
CPC ............ H05K 7/20445; H05K 5/0021; H05K 7/20127; G06F 1/20
See application file for complete search history.

(56) References Cited

U.S. PATENT DOCUMENTS 5,737,189 A * 4/1998 Kammersgard .......... G06F 1/18
                                                    312/107.5
6,297,958 B1 * 10/2001 Lutz, Jr. ............. H05K 7/20009
                                                    174/522

(Continued)

FOREIGN PATENT DOCUMENTS

WO    WO 2014086771    6/2014

OTHER PUBLICATIONS

"Alpine Electronics of Asia Pacific", Alpine Driving Mobile Media Innovation; pp. 1-2, http://www.alpine-asia.com/product/Amplifier/PDX-V9;.

(Continued)

*Primary Examiner* — Anthony M Haughton
*Assistant Examiner* — Yahya Ahmad
(74) *Attorney, Agent, or Firm* — Haynes and Boone, LLP

(57) ABSTRACT

A switch includes a switch chassis that houses a heat producing component. A plurality of side walls are located on the switch chassis and define a chassis perimeter. A top wall extends between the plurality of side walls and defines a top wall perimeter vent adjacent the chassis perimeter. A bottom wall extends between the plurality of side walls, is located opposite the switch chassis from the top wall, and defines a bottom wall perimeter vent adjacent the chassis perimeter. A plurality of feet are located on the bottom wall and provide an air gap between the switch chassis and a support surface when the plurality of feet engage the support surface. In response to the heat producing component generating heat, fresh air is drawn in through the air gap and the bottom wall perimeter vent, and heated air flows through the top wall perimeter vent.

20 Claims, 11 Drawing Sheets

(56) References Cited

U.S. PATENT DOCUMENTS

| | | | |
|---|---|---|---|
| 6,867,966 B2* | 3/2005 | Smith | H05K 7/1488 |
| | | | 211/175 |
| 7,209,351 B2 | 4/2007 | Wei | |
| 7,800,907 B2* | 9/2010 | Huang | H05K 7/20336 |
| | | | 165/104.26 |
| 9,596,772 B2* | 3/2017 | Ruberto | H05K 5/0021 |
| 2004/0228093 A1 | 11/2004 | Lee | |
| 2006/0002084 A1* | 1/2006 | Wei | H05K 7/20745 |
| | | | 361/695 |
| 2006/0018094 A1* | 1/2006 | Robbins | H05K 7/20563 |
| | | | 361/695 |
| 2006/0148398 A1* | 7/2006 | Ruch | H05K 5/0213 |
| | | | 454/184 |
| 2008/0217962 A1* | 9/2008 | Boduch | H05K 7/1425 |
| | | | 296/204 |
| 2009/0009969 A1 | 1/2009 | Chu | |
| 2011/0304980 A1 | 12/2011 | Adkins et al. | |
| 2012/0318756 A1* | 12/2012 | Elwany | H05K 7/20736 |
| | | | 211/26 |
| 2014/0078673 A1* | 3/2014 | Vincent | H05K 7/20336 |
| | | | 361/700 |
| 2016/0212884 A1 | 7/2016 | Ruberto et al. | |

OTHER PUBLICATIONS

"Zeno NT-TX200 Fanless Media Case With Heatpipe CPU Cooler," NT-TX2000 Fanless Media Case With Heatpipe CPU Cooler, 2000-2015, pp. 1-3, Quiet PC Ltd., htpp://www.quietpc.com/zen-nt-tx2000.

"Tavendo Wolke 36 Green Computing for the Cloud," 2011-2014, pp. 1-7, Tavendo GmbH, http://tavendo.com/wolke/.

* cited by examiner

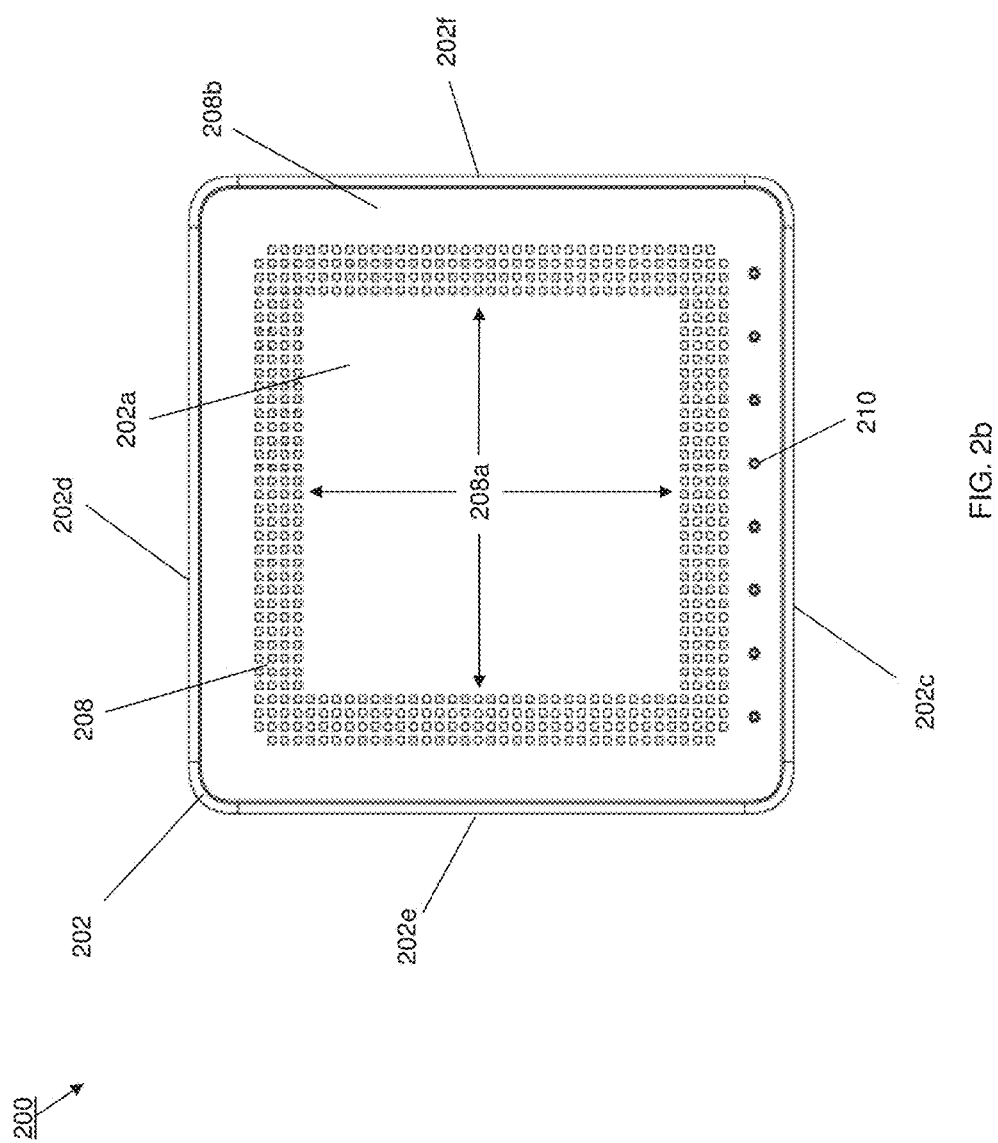

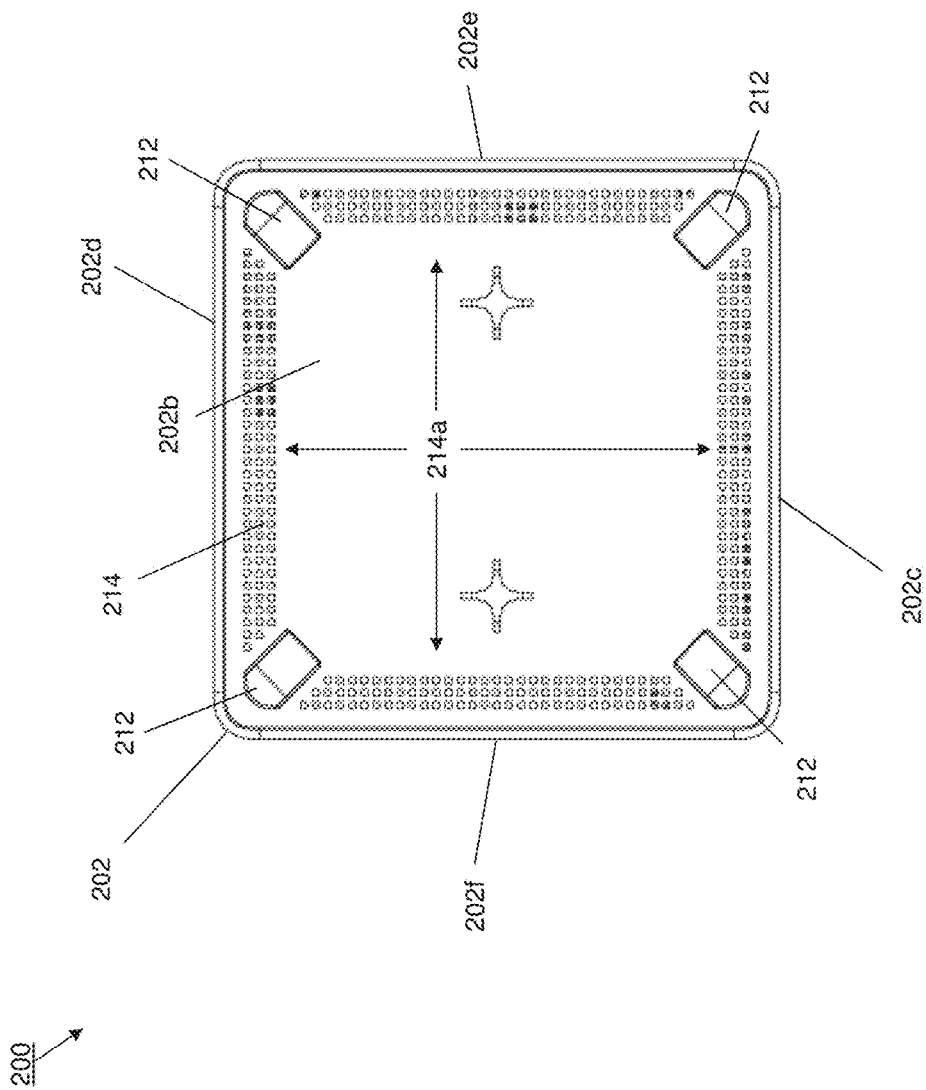

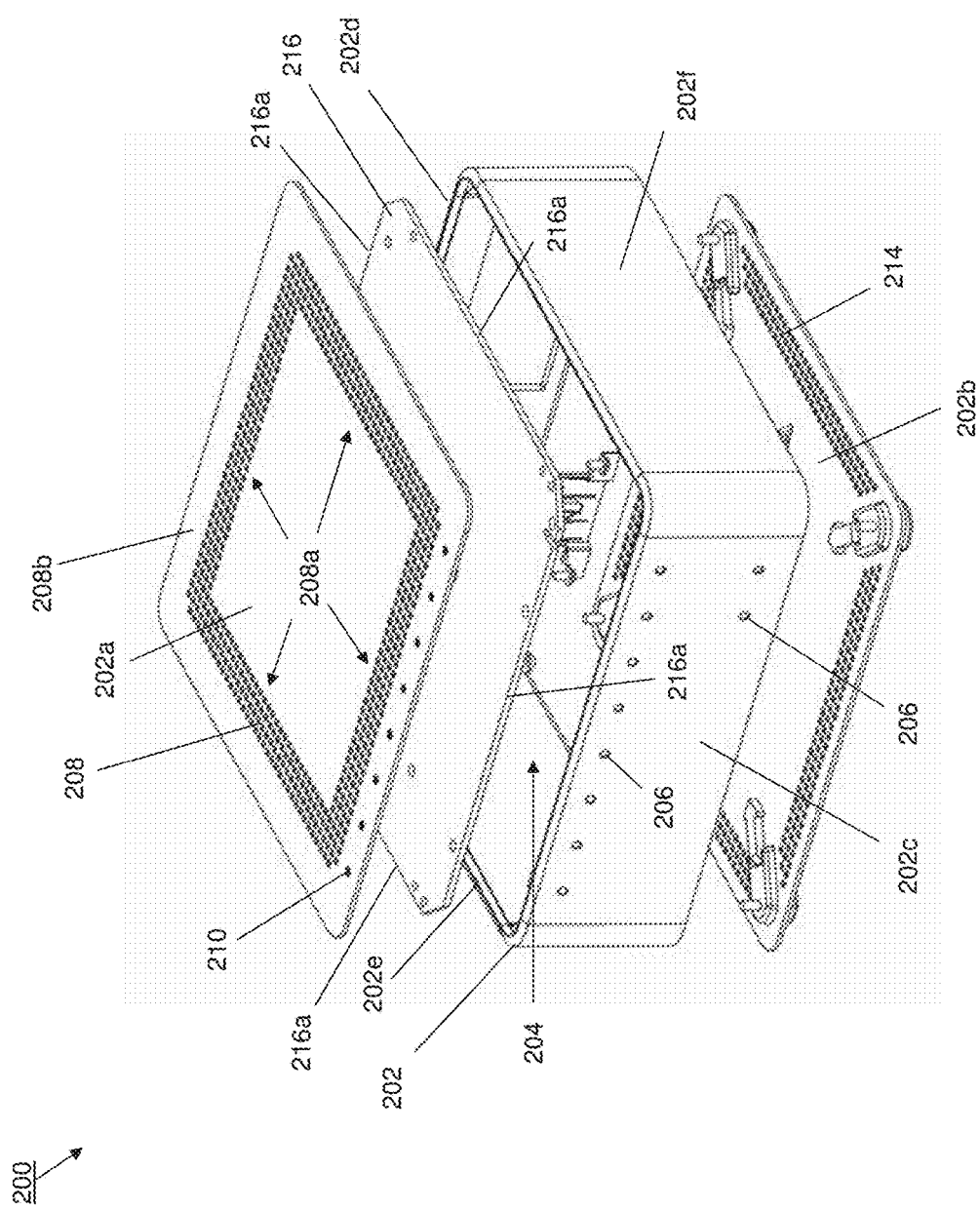

STACKABLE SWITCH COOLING SYSTEM

CROSS-REFERENCE TO RELATED APPLICATIONS

This is a Continuation application to U.S. Utility application Ser. No. 14/597,939 filed Jan. 15, 2015, entitled "STACKABLE SWITCH COOLING SYSTEM," the disclosure of which is incorporated herein by reference in its entirety.

BACKGROUND

The present disclosure relates generally to information handling system (IHSs), and more particularly to stackable switch IHSs with enhanced cooling.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some IHSs such as, for example, switches and other networking devices known in the art, include a variety of heat producing components that generate heat during the operation of the switch. As switches connect to more serves, storage systems, and/or other IHSs known in the art in order to route data between those IHSs, the components of the switch consume more power and generate more heat in order to perform the operations of the switch, and the need to dissipate that heat grows. Conventional methods for dissipating heat in a switch involve including additional and/or higher powered fans and increasing the size of the switch chassis to allow for more airflow through the chassis. However, such conventional solutions can increase the size and cost of the switch, increase the noise produced by the switch during operation, and provide a number of other negative consequences known in the art.

Accordingly, it would be desirable to provide an improved switch cooling system.

SUMMARY

According to one embodiment, a switch system includes a first switch having a first top wall perimeter vent that is defined by a first switch top wall, and a first bottom wall perimeter vent that is defined by a first switch bottom wall that is located opposite the first switch from the first switch top wall. The switch system also includes a second switch that is configured to be positioned in a stacked configuration with the first switch such that a first air gap is provided between the first switch and the second switch. The second switch include a second top wall perimeter vent that is defined by a second switch top wall and that is positioned adjacent the first top wall perimeter vent when the second switch is positioned in the stacked configuration with the first switch, and a second bottom wall perimeter vent that is defined by a second switch bottom wall that is located opposite the second switch from the second switch top wall. In response to operation of the first switch and the second switch in the stacked orientation, fresh air is drawn in through the first air gap, the first bottom wall perimeter vent, and the second bottom wall perimeter vent, and heated air flows through the second top wall perimeter vent, the first bottom wall perimeter vent, and the first top wall perimeter vent.

BRIEF DESCRIPTION OF THE DRAWINGS

FIG. 2b is a top view illustrating an embodiment of the switch of FIG. 2a.

FIG. 2c is a bottom view illustrating an embodiment of the switch of FIG. 2a.

FIG. 2d is an exploded, perspective view illustrating an embodiment of the switch of FIG. 2a.

FIG. 3b is a cut-away, perspective view illustrating an embodiment of the switch of FIG. 3a.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
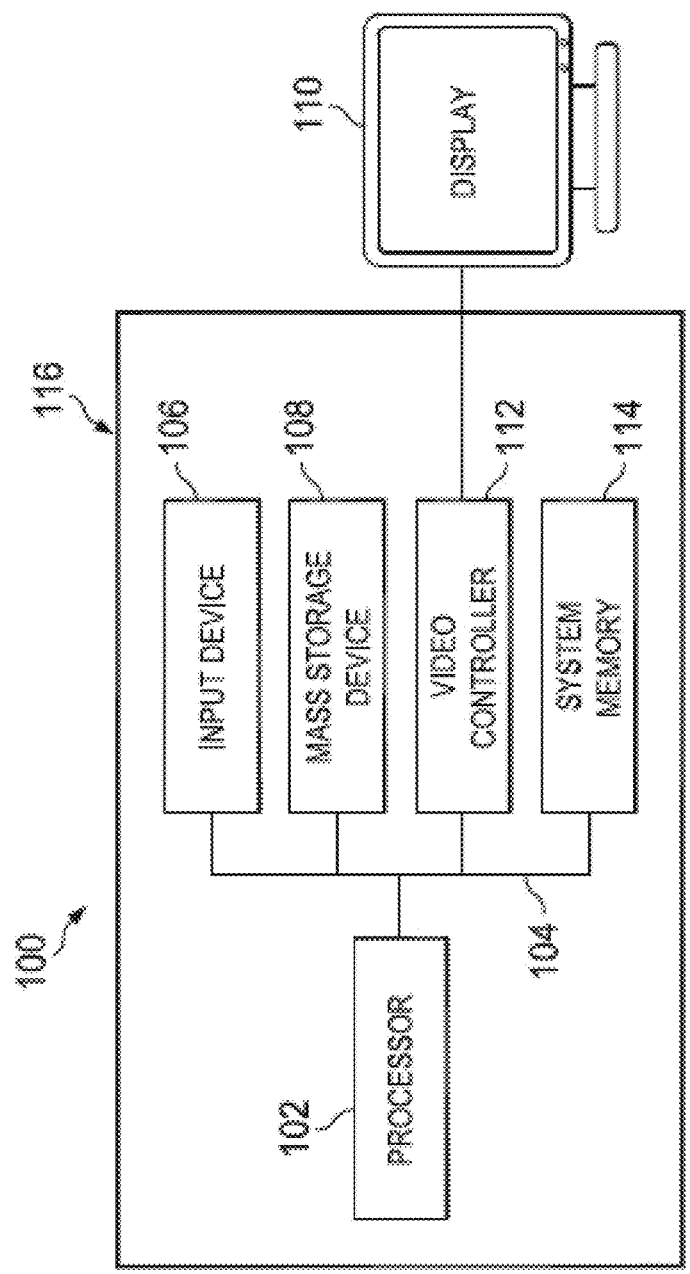
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
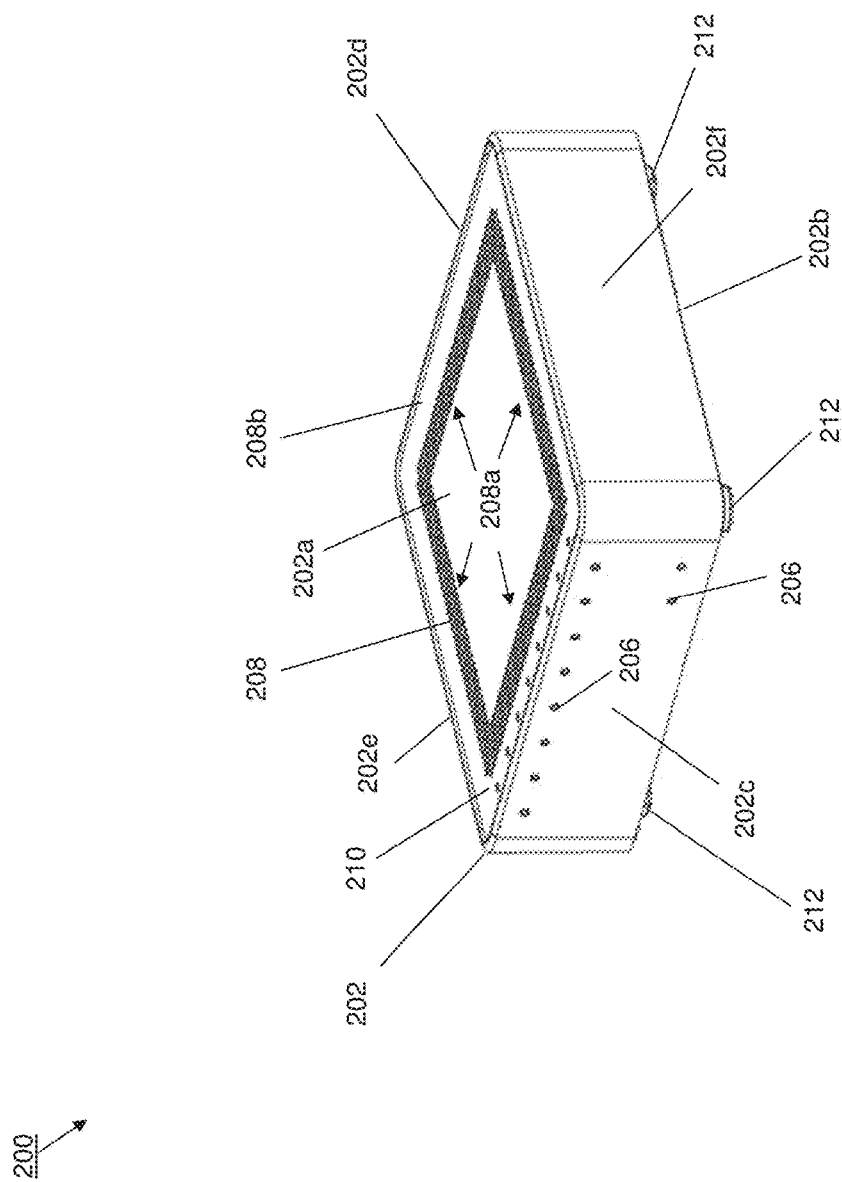
FIG. 2a is a perspective view illustrating an embodiment of a switch.

Referring now to FIGS. 2*a*-2*d*, an embodiment of a switch 200 is illustrated. The switch 200 may be the IHS 100 discussed above with reference to FIG. 1, and/or may include some or all of the components of the IHS 100. Furthermore, in non-illustrated embodiments, the cooling functionality discussed below for the switch 200 may be provided for any other type of IHS known in the art, including servers, storage systems, home computers, portable computers, set top boxes, home theater equipment, audio equipment, and/or any other device that would benefit from the teachings provided herein. The switch includes a chassis 202 having a top wall 202*a*, a bottom wall 202*b* that is located opposite the chassis 202 from the top wall 202*a*, a front side wall 202*c* that extends between the top wall 202*a* and the bottom wall 202*b*, a rear side wall 202*d* that extends between the top wall 202*a* and the bottom wall 202*b* and that is located opposite the chassis 202 from the front side wall 202*c*, and a pair of opposing side walls 202*e* and 202*f* that extend between the top wall 202*a*, the bottom wall 202*b*, the front side wall 202*c*, and the rear side wall 202*d* and that are located opposite the chassis 202 from each other. Referring to FIG. 2*d*, in some embodiments the portion of the chassis 202 that provides the front side wall 202*c*, the rear side wall 202*d*, and the side walls 202*e* and 202*f* may be provided by a single piece of extruded material such as, for example, aluminum, an aluminum alloy, and/or other materials known in the art. As such, the front side wall 202*c*, the rear side wall 202*d*, and the side walls 202*e* and 202*f* may be provided on the chassis without any seams, breaks, or discontinuities, which as discussed below may enhance heat transfer and heat dissipation from heat producing components that are housed in the chassis 202. The top wall 202*a* and the bottom wall 202*b* may then be coupled to opposite sides of that extruded portion of the chassis 202 using coupling methods known in the art to define a chassis housing 204 between the top wall 202*a*, the bottom wall 202*b*, the front side wall 202*c*, the rear side wall 202*d*, and the side walls 202*e* and 202*f*. While a specific chassis configuration including a seamless, extruded portion that provides all of the side walls of the chassis 202, with top and bottom walls that couple to that extruded portion of the chassis 202, is illustrated and described herein, other configurations including coupled together side walls that are not part of a single, extruded portion of the chassis 202 are envisioned as falling within the scope of the present disclosure.

The front wall 202*c* includes a plurality of status indicators 206 that may be light emitting devices (LEDs) or other status indicators known in the art, and that may be coupled to one or more switch components or systems that are located in the chassis housing 204. The top wall 202*a* defines a top wall perimeter vent 208 that extends through the top wall 202*a* to provide an air channel between the chassis housing 204 and a volume outside of the chassis 202 and adjacent the top wall 202*a*. In the illustrated embodiment, the top wall perimeter vent 208 is located on the top wall 202*a* between a perimeter of the chassis 202 that is defined by the front side wall 202*c*, the rear side wall 202*d*, and the side walls 202*e* and 202*f* (e.g., the perimeter of the chassis 202*a* as viewed from the top view of FIG. 2*b* and the bottom view of FIG. 2*c*), and a top wall center portion 208*a* that does not define or include venting. Furthermore, in the illustrated embodiment, the top wall perimeter vent 208 is spaced apart from the perimeter of the chassis 202 such that a non-vented perimeter section 208*b* is located between the top wall perimeter vent 208 and each of the front side wall 202*c*, the rear side wall 202*d*, and the side walls 202*e* and 202*f*. In the illustrated embodiment, a portion of the non-vented perimeter section 208*b* that is located adjacent the front wall 202*c* includes a plurality of status indicators 210 that may be light emitting devices (LEDs) or other status indicators known in the art, and that may be coupled to one or more switch components or systems that are located in the chassis housing 204. However, while a specific configuration of the top wall perimeter vent is illustrated and described herein, other configurations of the top wall perimeter vent such as, for example, a top wall perimeter vent that extends all the way to the perimeter of the chassis 202, a top wall perimeter vent that is located adjacent the perimeter of the chassis 202 but with breaks or non-vented portions about at least some of the perimeter of the chassis 202, etc., are envisioned as falling within the scope of the present disclosure.

The bottom wall 202*b* includes a plurality of feet 212 that, in the illustrated embodiment, are positioned at each of the corners of the bottom wall 202*b* and adjacent the perimeter of the chassis 202. However, other locations of the feet 212 will fall within the scope of the present disclosure. The bottom wall 202*b* defines a bottom wall perimeter vent 214 that extends through the bottom wall 202*b* to provide an air channel between the chassis housing 204 and a volume outside of the chassis 202 and adjacent the bottom wall 202*b*. In the illustrated embodiment, the bottom wall perimeter vent 214 is located on the bottom wall 202*b* between the perimeter of the chassis 202 that is defined by the front side wall 202*c*, the rear side wall 202*d*, and the side walls 202*e* and 202*f* (e.g., the perimeter of the chassis 202*a* as viewed from the top view of FIG. 2*b* and the bottom view of FIG. 2*c*), and a bottom wall center portion 214*a* that does not define or include venting. Furthermore, in the illustrated embodiment, the bottom wall perimeter vent 214 is located adjacent the perimeter of the chassis 202 with each of the plurality of feet 212 located between sections of the bottom wall perimeter vent 214 such that breaks or non-vented portions are provided between sections of the bottom wall perimeter vent 214 by the feet 212. However, while a specific configuration of the bottom wall perimeter vent is illustrated and described herein, other configurations of the bottom wall perimeter vent such as, for example, a bottom wall perimeter vent that extends all the way to the perimeter of the chassis 202 or that is further spaced apart from the perimeter of the chassis 202, a bottom wall perimeter vent without any breaks or non-vented portions (i.e., with the feet positioned on the bottom wall center portion 214a) etc., are envisioned as falling within the scope of the present disclosure.

As can be seen in FIG. 2d, a board 216 such as, for example, a circuit board, may be provided in the chassis housing 204. As discussed in further detail below, the board 216 may be coupled to heat producing components and heat dissipation systems that are positioned in the chassis housing 204 such as, for example, processing systems (e.g., the processor 102 discussed above with reference to FIG. 1), memory systems (e.g., the system memory 114 discussed above with reference to FIG. 1), heat sinks, heat pipes, and/or a variety of other switch or IHS components known in the art. As such, the chassis 202 may include a variety of coupling and/or support features for coupling and/or supporting the board 216 and other components that are located in the chassis housing 204. As also discussed in further detail below, when the board 216 is positioned in the chassis housing 204, a perimeter edge 216a of the board 216 is spaced apart from any or all of the front side wall 202c, the rear side wall 202d, and the side walls 202e and 202f, in order to allow for airflow past the board 216 and through the chassis housing 204. For example, the board 216 may be dimensioned such that the perimeter of the board 216 is within the inner perimeter of the top wall perimeter vent 208 and bottom wall perimeter vent 214 (e.g., such that the perimeter of the board 216 does not extend past the outer perimeter of the top wall center portion 208a and bottom wall center portion 214a). However, in other examples, the perimeter of the board 216 may be dimensioned such that the perimeter of the board 216 extends into an airflow provided between the top wall perimeter vent 208 and bottom wall perimeter vent 214, discussed in further detail below. In several embodiments, the heat producing components and/or other components of the switch 200 may be positioned in the chassis housing 204 (e.g., coupled to the board 216) such that they are centrally located on the board 216 and within a perimeter airflow that is provided between the top wall perimeter vent 208 and bottom wall perimeter vent 214 as discussed below.

Figure 3A:
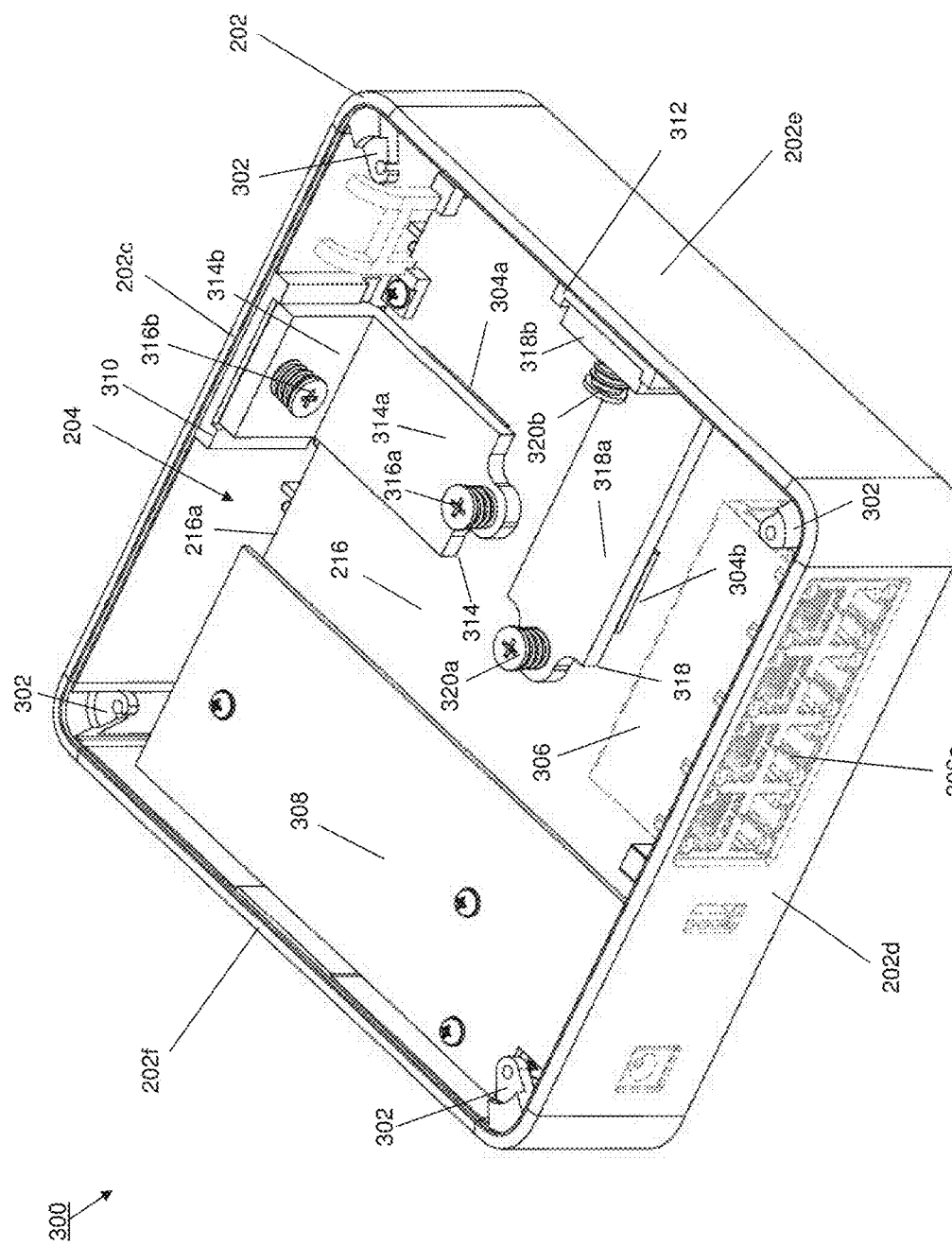
FIG. 3a is a cut-away, perspective view illustrating an embodiment of a switch including a switch housing with a plurality of components.
Figure 3B:
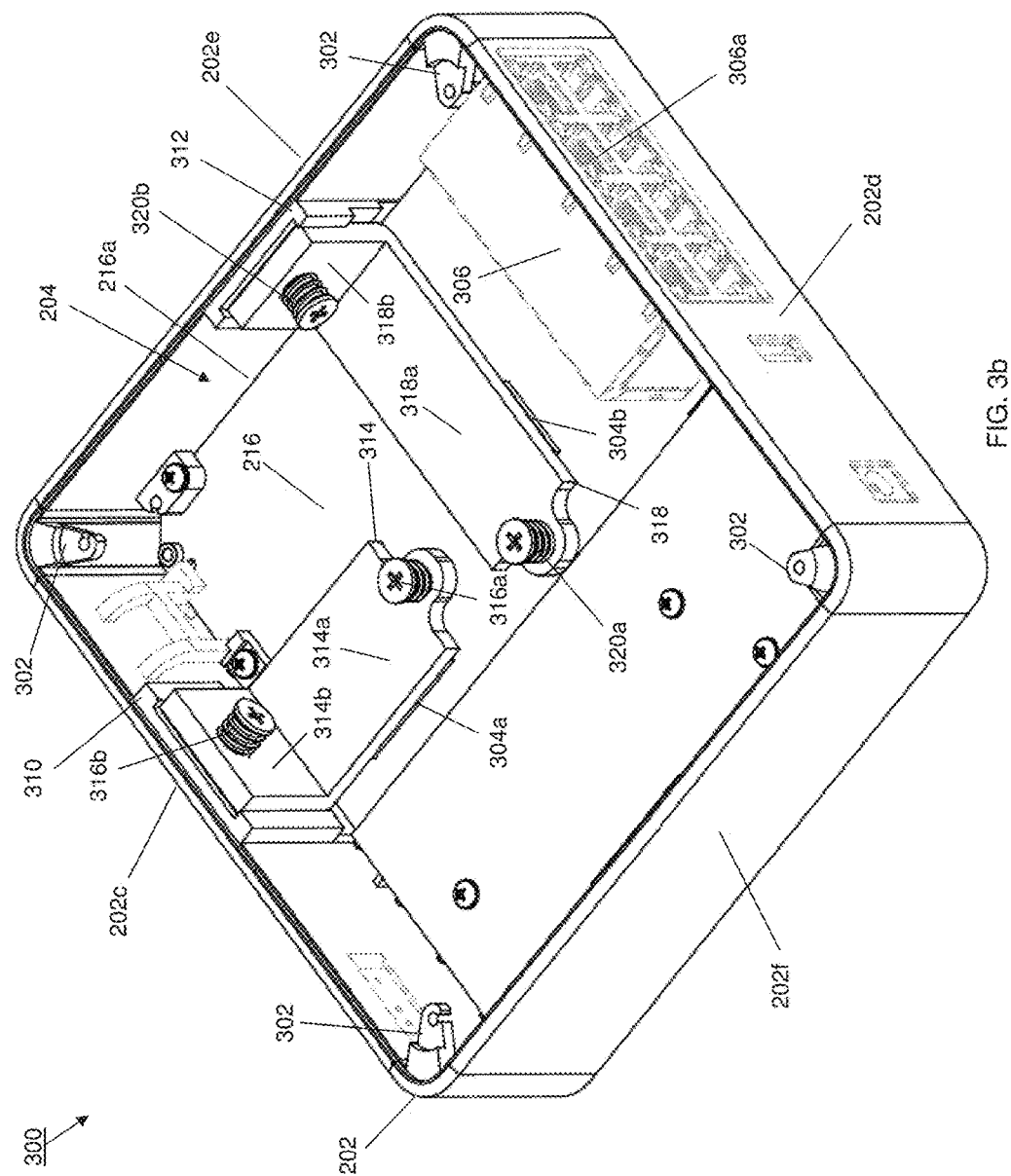
Figure 4:
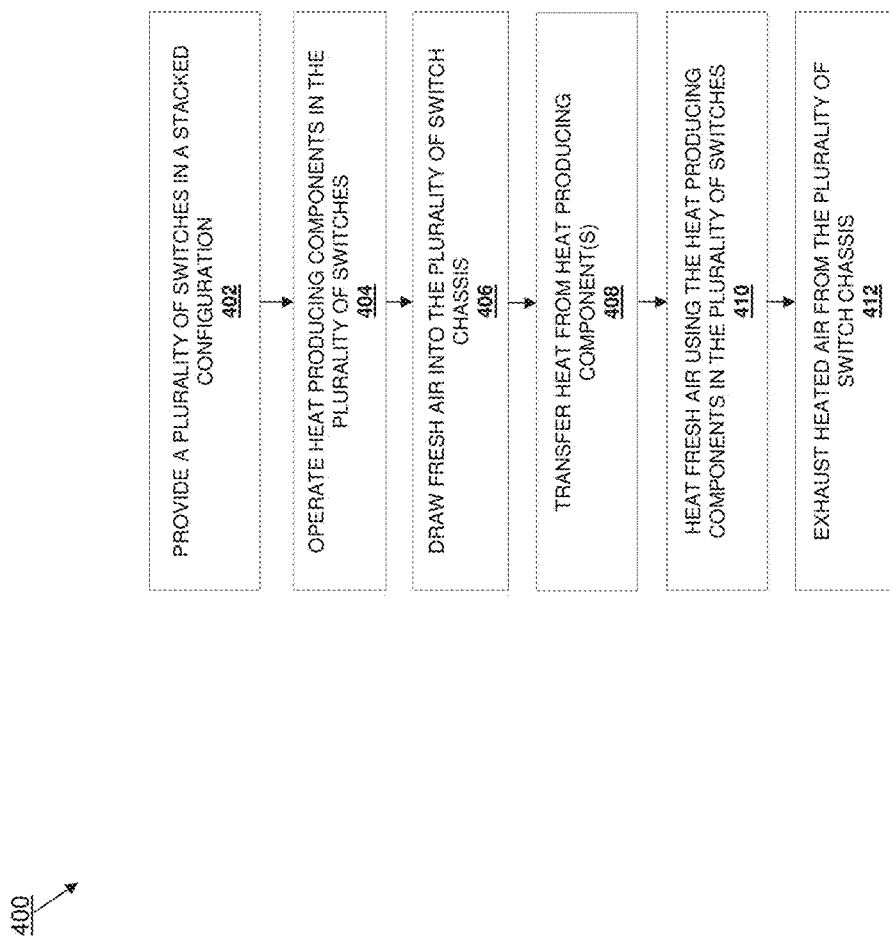
FIG. 4 is a flow chart illustrating an embodiment of a method for cooling an information handling system.

Referring now to FIGS. 3a and 3b, a switch 300 is illustrated that may be a specific embodiment of the switch 200 discussed above that includes specific components housed in the chassis housing 204. As such, the chassis 300 is illustrated and described below with similar features to the switch 200 including the same reference numbers. As discussed above, the chassis 202 of the switch 200 may include a variety of coupling and/or support features for coupling and/or supporting the board 216 and other components of the switch 200, and the switch 300 of FIGS. 3a and 3b illustrates a few of those features. For example, a plurality of a top wall coupling members 302 extend into the chassis housing 204 from each of the corners of the portion of the chassis 202 that provides front side wall 202c, the rear side wall 202d, and the side walls 202e and 202f, and are configured to couple the top wall 202a to that portion of the chassis 202. Similar features may be provided for coupling the bottom wall 202b to that portion of the chassis 202 as well. A plurality of heat producing components, illustrated as processing systems 304a and 304b in FIGS. 3a and 3b, are coupled to the board 216 using methods known in the art. A switch connector system 306 is coupled to the board 216 and includes a plurality of connectors 306a (e.g., Ethernet connectors or other connections known in the art) that may be provided adjacent a connector channel defined by the rear side wall 202d such that the connectors 306a are accessible through the side wall 202d. As can be seen in FIGS. 3a and 3b, other connectors may be provided on the rear side wall 202d as well. A riser 308 is coupled to the board 216 adjacent the side wall 202f. While specific components have been illustrated and described as being coupled to the board 216 and/or positioned in the chassis housing 204, a wide variety of other components may be coupled to the board 216 and/or positioned in the chassis housing 204 while remaining within the scope of the present disclosure.

In the illustrated embodiment, the front side wall 202c includes a heat transfer device coupling member 310 that is located adjacent the chassis housing 204, and the side wall 202e includes a heat transfer device coupling member 312 that is also located adjacent the chassis housing 204. Each of the heat transfer device coupling members 310 and 312 may be made of the same material as the front side wall 202c and side wall 202e, respectively, and in some embodiments may be part of a single piece of extruded material that provides the front side wall 202c and the side wall 202e. As such, the heat transfer device coupling members 310 and 312 may be aluminum, an aluminum alloy, and/or other material known in the art. However, in other embodiments, the heat transfer device coupling members 310 and 312 may attached to the front side wall 202c and side wall 202e, respectively, and/or may be made from a different material than the front side wall 202c and side wall 202e.

A heat transfer device 314 includes a first heat transfer member 314a and a second heat transfer member 314b that are oriented in an L-shaped configuration, and the heat transfer device 314 may be positioned in the chassis housing 204 such that the first heat transfer member 314a engages the processing system 304a and the second heat transfer member 314b engages the heat transfer device coupling member 310. The heat transfer device 314 may then be secured in its engagement with the processing system 304a and the front side wall 202c by a coupling member 316a that extends through the first heat transfer member 314a and the board 216, and a coupling member 316b that extends through the second heat transfer member 314b and into the heat transfer device coupling member 310. The heat transfer device 314 may be made of the same material as the front side wall 202c. As such, the heat transfer device 314 may be aluminum, an aluminum alloy, and/or other material known in the art. However, in other embodiments, the heat transfer device 314 may be made from a different material than the front side wall 202c.

Another heat transfer device 318 includes a first heat transfer member 318a and a second heat transfer member 318b that are oriented in an L-shaped configuration, and the heat transfer device 318 may be positioned in the chassis housing 204 such that the first heat transfer member 318a engages the processing system 304b and the second heat transfer member 318b engages the heat transfer device coupling member 312. The heat transfer device 318 may then be secured in its engagement with the processing system 304b and the side wall 202e by a coupling member 320a that extends through the first heat transfer member 318a and the board 216, and a coupling member 320b that extends through the second heat transfer member 318b and into the heat transfer device coupling member 312. The heat transfer device 318 may be made of the same material as the side wall 202e. As such, the heat transfer device 318 may be aluminum, an aluminum alloy, and/or other material known in the art. However, in other embodiments, the heat transfer device 318 may be made from a different material than the side wall 202e. The examples of the heat transfer devices 314 and 318 in FIGS. 3a and 3b illustrate how the dimensions of heat transfer devices provided according to the present disclosure may be adjustable (e.g., length, width, thickness, etc.) to conform to a variety of component heat transfer applications and requirements within a chassis.

In the embodiments illustrated in FIGS. 3a and 3b, as well as in many other embodiments contemplated using the teachings of the present disclosure, the chassis housing does not include a fan system. As discussed in further details below, the features of the chassis 202 as well as, in some embodiments, heat transfer devices such as the heat transfer devices 314 and 318 and/or other components included in the chassis housing 204, provide a cooling system for the switch 200/300 that negates the need for a fan system or fans that actively draw air into and/or push air out of the chassis housing 204, or move air over the components housed in the chassis 200. The ability to cool the components of the switch 200 sufficiently without a fan system provides for quiet operation of and reduced power consumption by the switch 200, as well as other benefits that would be recognized by one of skill in the art in possession of the present disclosure. However, embodiments of the present disclosure that include a fan system are envisioned as falling within the scope of the present disclosure.

Figure 5A:
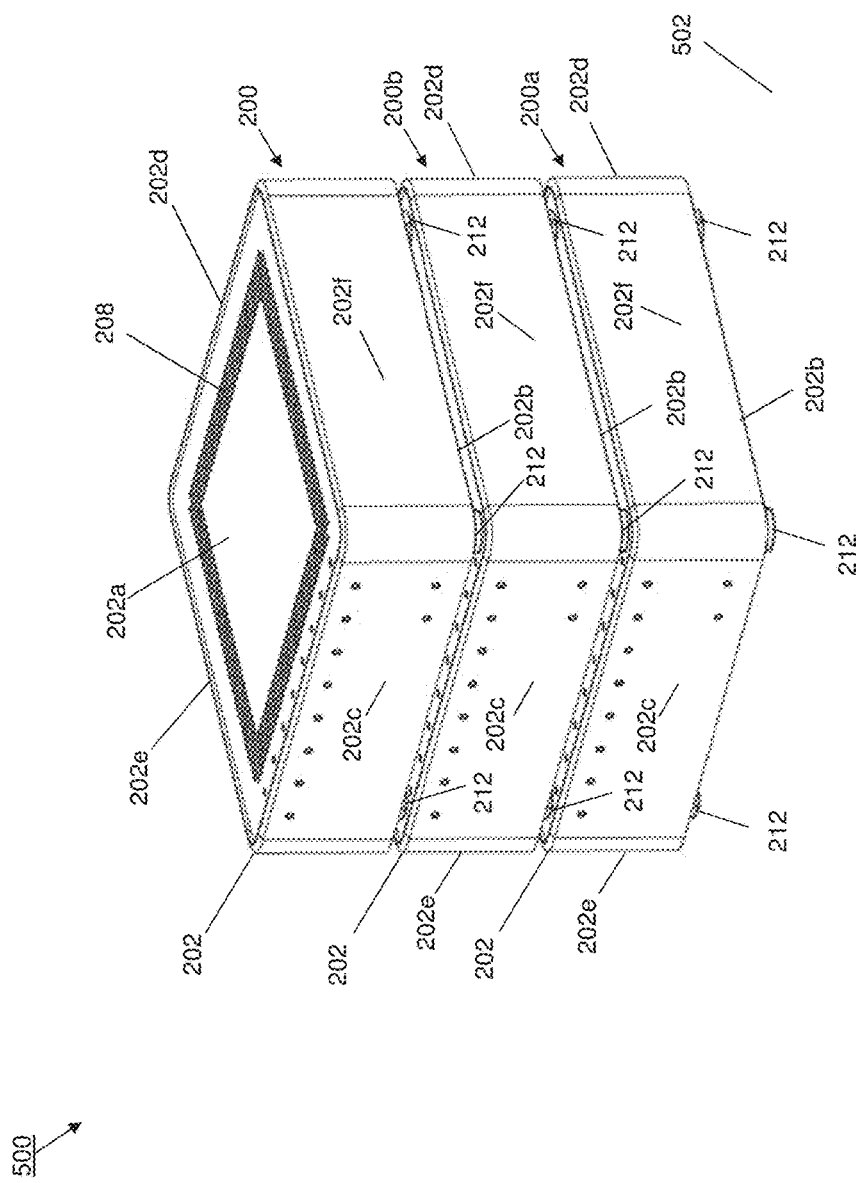
FIG. 5a is a perspective view illustrating a plurality of the switches of FIGS. 2a-2d in a stacked configuration.
Figure 5B:
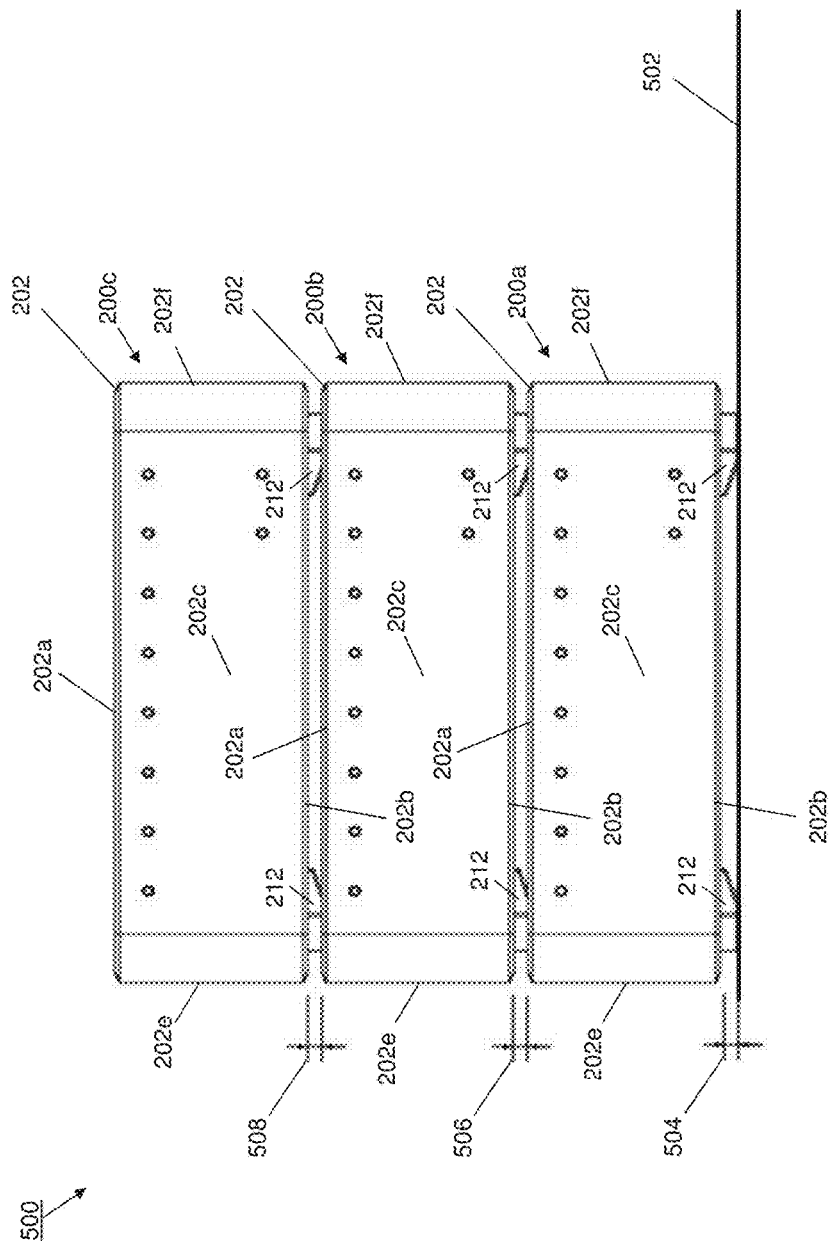
FIG. 5b is a side view illustrating the plurality of the switches of FIG. 5a in the stacked configuration.

Referring now to FIGS. 4, 5a, 5b, and 6, a method 400 for cooling an IHS such as a switch is illustrated. The method 400 begins at block 402 where a plurality of switches are provided in a stacked configuration. Referring now to FIGS. 5a and 5b, a plurality of the switches 200 discussed above with reference to FIGS. 2a-d are illustrated in a stacked configuration 500. The plurality of switches 200 in the stacked configuration 500 of FIGS. 5a, 5b, and 5c are substantially similar to the switch 200 discussed above with reference to FIG. 2, and in the illustrated embodiment, include a switch 200a, a switch 200b, and a switch 200c. However, one of skill in the art in possession of the present disclosure would understand that any number of switches or IHSs including the features taught in the present disclosure may be provided in a stacked configuration to realize similar benefits while remaining within the scope of the present disclosure, and different types of IHSs (e.g., storage IHSs, server IHSs, etc.) may be included in chassis that utilize the teachings of the present disclosure and provided in the stacked configuration 500 as well.

In the illustrated embodiment, the switch 200a is positioned on a support surface 502 by engaging each of the feet 212 on the switch 200a with the support surface 502. As can be seen in FIG. 5b, with the feet 212 of the switch 200a engaging the support surface 502, a first air gap 504 is provided between the support surface 502 and the bottom wall 202b of the switch 200a. The switch 200b is then positioned on the top wall 202a of the switch 200a by engaging each of the feet 212 on the switch 200b with the top wall 202a of the switch 200a. As can be seen in FIG. 5b, with the feet 212 of the switch 200b engaging the top wall 202a of the switch 200a, the switch 200b is in a stacked orientation with the switch 200a, and a second air gap 506 is provided between the bottom wall 202b of the switch 200b and the top wall 202a of the switch 200a. The switch 200c is then positioned on the top wall 202a of the switch 200b by engaging each of the feet 212 on the switch 200c with the top wall 202a of the switch 200b. As can be seen in FIG. 5b, with the feet 212 of the switch 200c engaging the top wall 202a of the switch 200b, the switch 200c is in a stacked orientation with the switch 200b, and a third air gap 508 is provided between the bottom wall 202b of the switch 200c and the top wall 202a of the switch 200b. As will be understood by one of skill in the art in possession of the present disclosure, additional switches may be added to the stacked configuration 500 by positioning another switch 200d in a stacked orientation with the switch 200c substantially as described above, positioning another switch 200e in stacked orientation with the switch 200d substantially as described above, and so on. In addition, the dimensions of the chassis 202 (e.g., the extruded portion that provides the front side wall 202c, the rear side wall 202d, and the side walls 202e and 202f), the dimensions of the feet 212, the venting patterns (i.e., of the top wall perimeter vent 208 and the bottom wall perimeter vent 214), and/or other features of the switches may be adjusted to provide a desired height, a desired fresh air inflow to the chassis housings 204 (e.g., via the air gaps 504, 506, and 508), and other heat dissipation requirements for components within the chassis.

The method 400 then proceeds to block 404 where heat producing components in the plurality of switches are operated. For example, the processing systems 304a and 304b, as well as any other components (heat producing or not) may be operated at block 404 to cause heat to be produced in the chassis housing 204 of each of the switches 200a, 200b, and 200c. The method 400 the proceeds to block 406 where fresh air is drawn into the switch chassis. In an embodiment, the production of heat in the chassis housing 204 of each of the switches 200a, 200b, and 200c in response to operation of their respective heat producing components cause the air in each of the chassis housing 204 to be heated, which as is understood in the art causes that air to expand and become less dense, and as a result rise in the chassis housing 204 of each of the switches 200a, 200b, and 200c. Such heating and rising of the air in the chassis housing 204 of each of the switches 200a, 200b, and 200c causes the air in the chassis housing 204 to move in an airflow direction 600 and between the space defined between the perimeter of the board 216 and each of the front side wall 202c, the rear side wall 202d, and the side walls 202e and 202f. The air in the chassis housing 204 that moves in the airflow direction 600 will then move in airflow directions 602a, 602b, and 602c such that it is exhausted out of the chassis housing 204 through the top wall perimeter vent 208 on each of the switches 200a, 200b, and 200c, respectively.

Additionally, the movement of the air in the airflow direction 600 through the chassis housing 204 and in the airflow directions 602a, 602b, and 602c out of the chassis housing 204 of each of the switches 200a, 200b, and 200c causes fresh air to be drawn into the chassis housing 204 of each of the switches 200a, 200b, and 200c through the air gap adjacent the bottom wall perimeter vent on that switch. For example, the movement of the air in the airflow direction 600 through the chassis housing 204 and in the airflow direction 602a out of the chassis housing 204 of the switch 200a causes fresh air to be drawn into the chassis housing 204 of the switch 200a in an airflow direction 604a through the first air gap 504 adjacent the bottom wall perimeter vent 214 on the switch 200a, the movement of the air in the airflow direction 600 through the chassis housing 204 and in the airflow direction 602b out of the chassis housing 204 of the switch 200b causes fresh air to be drawn into the chassis housing 204 of the switch 200b in an airflow direction 604b through the second air gap 506 adjacent the bottom wall perimeter vent 214 on the switch 200b, and the movement of the air in the airflow direction 600 through the chassis housing 204 and in the airflow direction 602c out of the chassis housing 204 of the switch 200c causes fresh air to be drawn into the chassis housing 204 of the switch 200c in an airflow direction 604c through the third air gap 508 adjacent the bottom wall perimeter vent 214 on the switch 200c.

The method 400 then proceeds to block 408 where heat is transferred from heat producing components. As the air moves through the chassis housing 204 of each of the switches 200a, 200b, and 200c (i.e., fresh air in the airflow directions 604a, 604b, and 604c, through the respective bottom wall perimeter vents 214, in the airflow directions 600, and out of the respective top wall perimeter vents 208), heat is transferred from the heat producing components (e.g., the processing systems 304a and 304b) in the chassis housing 204 to the air moving through the chassis housing 204. As discussed above, in some embodiments, the heat producing components may be positioned in the chassis housing 204 (e.g., coupled to the board 216) such that they are substantially centrally located in the chassis housing 204 and within the perimeter airflow provided between the top wall perimeter vent 208 and the bottom wall perimeter vent 214 during operation of the switches 200a, 200b and 200c (i.e., the air that moves in the airflow direction 600 and past the board 216). It has been found that when such a perimeter airflow is provided through the chassis housing 204 between the top wall perimeter vent 208 and the bottom wall perimeter vent 214 (e.g., in the airflow direction 600), that perimeter airflow operates to draw air that is heated by such centrally located heat producing components away from those components and into the perimeter airflow moving in the airflow direction 600. As such, by centrally positioning the heat producing components in the chassis housing 204 and providing perimeter airflow through the chassis housing, heat is drawn away from the heat producing components by the airflow, and that heated air is exhausted out of the chassis housing 204 through the top wall perimeter vent 208.

In addition, in embodiments such as those illustrated in FIGS. 3a and 3b, heat transfer devices may transfer heat from the heat producing components to the chassis 202. For example, as the processing system 304a operates, heat generated by the processing system 304a is transferred to the first heat transfer member 314a on the heat transfer device 314, and that heat then conducts or diffuses through the first heat transfer member 314a to the second heat transfer member 314b on the heat transfer device 314, and then to the front side wall 202c of the chassis 202 through the heat transfer device coupling member 310. Similarly, as the processing system 304b operates, heat generated by the processing system 304b is transferred to the first heat transfer member 318a on the heat transfer device 318, and that heat then conducts or diffuses through the first heat transfer member 318a to the second heat transfer member 318b on the heat transfer device 318, and then to the side wall 202e of the chassis 202 through the heat transfer device coupling member 312. The heat transferred from the processing systems 304a and 304b, through the heat transfer devices 314 and 318, and to the front side wall 202c and side wall 202e is then radiated away from the side walls of chassis 202 in a radiant heat dissipation direction 606. In addition, in embodiments that include the heat transfer devices 314 and 318, the perimeter airflow that moves in the airflow direction 600 may flow over the heat dissipation devices 314 and 318 (e.g., at least the second heat transfer members 314b and 318b that extend past the board 216 and into contact with the front side wall 202c and the side wall 202e) to cool the heat transfer devices 314 and 318.

The method 400 then proceeds to block 410 where fresh air is heated using the heat producing components in the plurality of switches. Similarly as discussed above, the fresh air that is unheated by the components in the chassis housing 204 of the switches 200a, 200b, and 200c and that enters the chassis housing 204 from outside the chassis 202 in the airflow directions 604a, 604b, and 604c through the first air gap 504, the second air gap 506, and the third air gap 508, respectively, will be heated by the heat producing components and heat transfer devices in the chassis housing 204 of the switches 200a, 200b, and 200c, resulting in heated air that rises, moves in the airflow direction 600, and draws further fresh air into the chassis housing 204 of the switches 200a, 200b, and 200c. The method 400 then proceeds to block 412 where heated air is exhausted from the plurality of switch chassis. Similarly as discussed above, the air that is heated in the chassis housing 204 of the switches 200a, 200b, and 200c will exit or exhaust from the chassis housing 204 through the top wall perimeter vent 208, and in some cases may enter the chassis housing 204 of an adjacent chassis 202 through its bottom wall perimeter vent 214.

Figure 6:
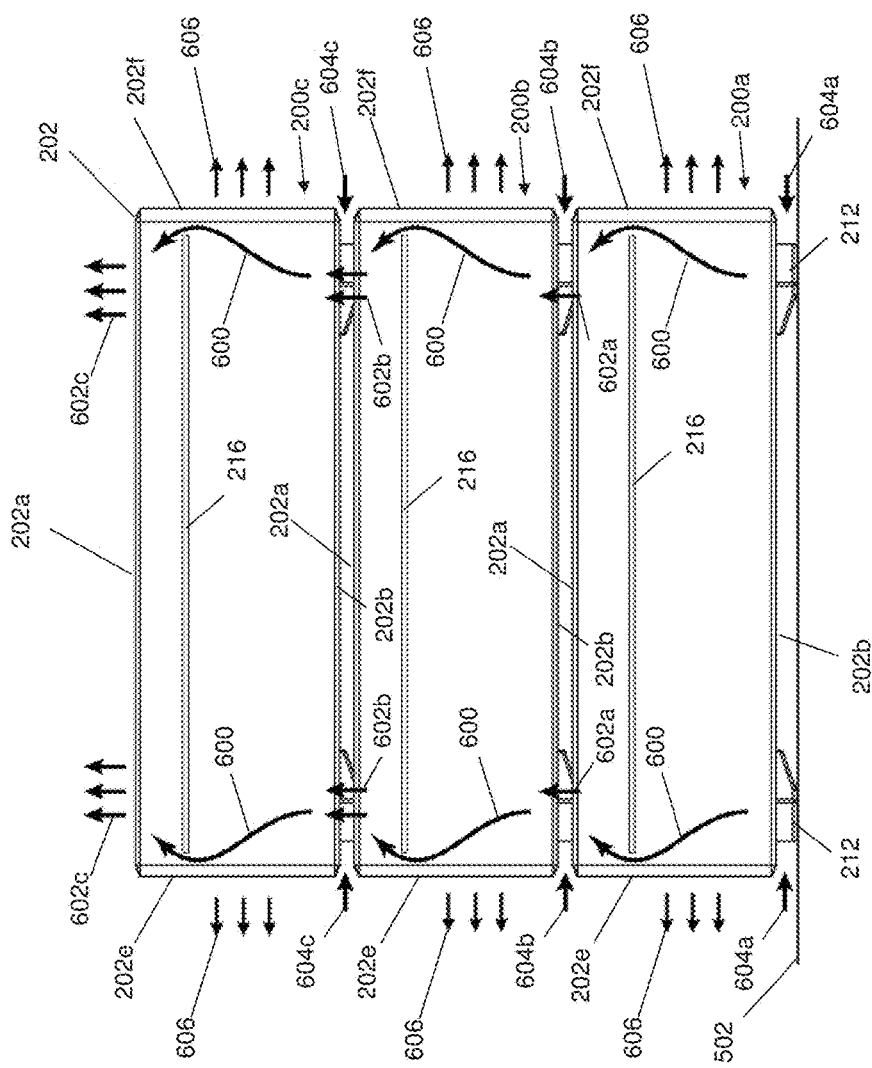
FIG. 6 is a side view illustrating airflow and heat dissipation for the plurality of the switches of FIG. 5a in the stacked configuration during their operation.

Using the specific example illustrated in FIG. 6, the operation of the switch 200a heats the air in the chassis housing 204 of the switch 200a such that that air rises and moves in the airflow direction 600, which causes fresh air from outside the chassis 202 to move in the airflow direction 604a through the first air gap 504 and into the chassis housing 204 through the bottom wall perimeter vent 214 of the switch 200a. The heated air moving in the direction 600 in the chassis housing 204 of the switch 200a then moves in the airflow direction 602a out of the chassis housing 204 and through the top wall perimeter vent 208 on the switch 200a. In an embodiment, the use of the fresh air moving in the airflow direction 604a through the first air gap 504 as the sole source of inlet cooling air for the switch 200a is indicated by the single arrow illustrating the airflow direction 602a.

In addition, the operation of the switch 200b heats the air in the chassis housing 204 of the switch 200b such that that air rises and moves in the airflow direction 600, which causes fresh air from outside the chassis 202 to move in the airflow direction 604b through the second air gap 506 and into the chassis housing 204 through the bottom wall perimeter vent 214 of the switch 200b. In addition, the heated air exhausted out of the top wall perimeter vent 208 of the switch 200a (i.e., in the airflow direction 602a) may also enter the chassis housing 204 of the switch 200b through its bottom wall perimeter vent 214. The heated air moving in the direction 600 in the chassis housing 204 of the switch 200b then moves in the airflow direction 602b out of the chassis housing 204 and through the top wall perimeter vent 208 on the switch 200b. In an embodiment, the use of the fresh air moving in the airflow direction 604b through the second air gap 50b as well as the air moving in the airflow direction 602a that is exhausted from the switch 200a as multiple sources of inlet cooling air for the switch 200b is indicated by the double arrows illustrating the airflow direction 602b.

Furthermore, the operation of the switch 200c heats the air in the chassis housing 204 of the switch 200c such that that air rises and moves in the airflow direction 600, which causes fresh air from outside the chassis 202 to move in the airflow direction 604c through the third air gap 508 and into the chassis housing 204 of the switch 200c through its bottom wall perimeter vent 214. In addition, the heated air exhausted out of the top wall perimeter vent 208 of the switch 200b (i.e., in the airflow direction 602b) may also enter the chassis housing 204 through the bottom wall perimeter vent 214 of the switch 200c. The heated air moving in the direction 600 in the chassis housing 204 of the switch 200c then moves in the airflow direction 602c out of the chassis housing 204 and through the top wall perimeter vent 208 on the switch 200c. In an embodiment, the use of the fresh air moving in the airflow direction 604c through the third air gap 506 as well as the air moving in the airflow direction 602b that is exhausted from the switch 200b (which includes the air that was exhausted from the switch 200a in the airflow direction 602a) as multiple sources of inlet cooling air for the switch 200c is indicated by the triple arrows illustrating the airflow direction 602c.

Thus, systems and methods for cooling an IHS have been described that provide a stackable switch system that includes a plurality of switches that include perimeter venting and that may be provided in stacked orientation to produce a perimeter based "chimney" cooling effect that draws heated air away from heat producing components in the switch, draws fresh air into the housings of the switches for cooling, and utilizes exhaust air from switches that are lower in the stack for cooling as well. Heat transfer devices may be employed to transfer heat to the walls of the switches for radiant heat dissipation, as well as to position the heat transfer devices in a portion of the perimeter cooling airflow to cool the heat transfer devices so that they may transfer additional heat from the heat producing components. The systems and methods have been found to negate the need for fan systems in several experimental embodiments, reducing the power consumed by the switch and the noise produced during the operation of the switch while providing sufficient cooling for its components.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A device cooling system, comprising:
   a first device including:
      a first device top wall that defines a first device top wall perimeter vent that is located between a first device perimeter and a first device top wall center portion that is free of venting;
      a first device bottom wall that is located opposite the first device from the first device top wall, wherein the first device bottom wall defines a first device bottom wall perimeter vent that is located between the first device perimeter and a first device bottom wall center portion that is free of venting; and
      a first device heat producing component that is located between the first device top wall center portion and the first device bottom wall center portion; and
   a second device that is positioned in a stacked orientation with the first device, wherein the second device includes:
      a second device top wall that defines a second device top wall perimeter vent that is located between a second device perimeter and a second device top wall center portion that is free of venting;
      a second device bottom wall that is located opposite the second device from the second device top wall, wherein the second device bottom wall defines a second device bottom wall perimeter vent that is located between the second device perimeter and a second device bottom wall center portion that is free of venting; and
      a second device heat producing component that is located between the second device top wall center portion and the second device bottom wall center portion,
      wherein, in response to operation of the first device and the second device in the stacked orientation, a perimeter airflow is created by:
         drawing first fresh air through the second device bottom wall perimeter vent such that the first fresh air flows in a first airflow perimeter around the second device heat producing component;
         heating the first fresh air using the second device heat producing component to provide first heated air;
         exhausting the first heated air through the second device top wall perimeter vent;
         drawing the first heated air that was exhausted through the second device top wall perimeter vent through a first air gap and the first device bottom wall perimeter vent such that the first heated air flows in a second airflow perimeter around the first device heat producing component;
         heating the first heated air using the first device heat producing component to provide second heated air; and
         exhausting the second heated air through the first device top wall perimeter vent.

2. The device cooling system of claim 1, further comprising:
   a second device board that is located between the second device top wall center portion and the second device bottom wall center portion, wherein the second device board includes the second device heat producing component, and wherein the first fresh air flows in the first airflow perimeter around the second device board when the perimeter airflow is created; and
   a first device board that is located between the first device top wall center portion and the first device bottom wall center portion, wherein the first device board includes the first device heat producing component, and wherein the first heated air flows in the second airflow perimeter around the first device board when the perimeter airflow is created.

3. The device cooling system of claim 1, further comprising:
   a second device heat transfer element engaging the second device heat producing component, wherein the second device heat transfer device transfers heat generated by the second device heat producing component to the second device perimeter such that the second device perimeter radiates at least some of the heat generated by the second device heat producing component, and wherein the first heated air is heated using at least some of the heat transferred by the second device heat transfer device; and
   a first device heat transfer element engaging the first device heat producing component, wherein the first device heat transfer device transfers heat generated by the first device heat producing component to the first device perimeter such that the first device perimeter radiates at least some of the heat generated by the first device heat producing component, and wherein the second heated air is heated using at least some of the heat transferred by the first device heat transfer device.

4. The device cooling system of claim 3, wherein the first device heat transfer element includes a heat transfer member that is orientated in an L-shaped configuration, and wherein the second device heat transfer element includes a heat transfer member that is orientated in an L-shaped configuration.

5. The device cooling system of claim 1, wherein the perimeter airflow is created by:
   drawing second fresh air through the first device bottom wall perimeter vent such that the second fresh air flows in the first airflow perimeter around the first device heat producing component;
   heating the second fresh air using the first device heat producing component to provide third heated air; and
   exhausting the third heated air through the first device top wall perimeter vent.

6. The device cooling system of claim 1, further comprising:
   a plurality of second device feet on the second device that engage a support surface to provide a second air gap between the second device and the support surface, wherein the first fresh air is drawn in through the second device bottom wall perimeter vent via the second air gap.

7. The device cooling system of claim 1, wherein each of the first device and the second device are free of a fan system.

8. An information handling system (IHS), comprising
   a chassis;
   a chassis top wall that defines a top wall perimeter vent that is located between a chassis perimeter and a top wall center portion that is free of venting;
   a chassis bottom wall that is located opposite the chassis from the chassis top wall, wherein the chassis bottom wall defines a bottom wall perimeter vent that is located between the chassis perimeter and a bottom wall center portion that is free of venting; and
   a heat producing component that is located between the top wall center portion and the bottom wall center portion,
   wherein, in response to the heat producing component generating heat, a perimeter airflow is created by:
      drawing fresh air through the bottom wall perimeter vent such that the fresh air flows in an airflow perimeter around the heat producing component;
      heating the fresh air using the heat generated by the heat producing component to provide heated air; and
      exhausting the heated air through the top wall perimeter vent.

9. The IHS of claim 8, further comprising:
   a first heat transfer device engaging the heat producing component, wherein the first heat transfer device is configured to transfer heat generated by the heat producing component to the chassis perimeter such that the chassis perimeter radiates at least some of the heat generated by the heat producing component, and wherein the heated air is heated using at least some of the heat transferred by the first heat transfer device.

10. The IHS of claim 9, wherein the first heat transfer device includes a first heat transfer member that is orientated in an L-shaped configuration, and wherein the first heat transfer member engages the heat producing component.

11. The IHS of claim 9, further comprising:
    a second heat transfer device engaging the heat producing component, wherein the second heat transfer device is configured to transfer heat generated by the heat producing component to the chassis perimeter such that the chassis perimeter radiates at least some of the heat generated by the heat producing component, and wherein the heated air is heated using at least some of the heat transferred by the second heat transfer device.

12. The IHS of claim 8, wherein the chassis perimeter is defined by a single piece of extruded material.

13. The IHS of claim 8, wherein the heat producing component is located on a circuit board that is housed in the chassis, and wherein the circuit board is oriented in the chassis to provide an air channel that allows the perimeter airflow from the bottom wall perimeter vent, through the air channel, and to the top wall perimeter vent when the heat producing component is generating heat.

14. The IHS of claim 8, wherein the chassis does not house a fan system.

15. A method for cooling a device, comprising:
    operating a first heat producing component housed in a first device between a first device top wall and a first device bottom wall, wherein the operating of the first heat producing component generates heat; and
    creating a perimeter airflow by:
       drawing, in response to operating the first heat producing component to generate heat, first fresh air through a first device bottom wall perimeter vent that is defined by the first device bottom wall between a first device perimeter and a device chassis bottom wall center portion that is free of venting, wherein the drawing the first fresh air through the first device bottom wall perimeter vent results in the first fresh air flowing in a first airflow perimeter around the first heat producing component;
       heating the first fresh air using the heat generated by the first heat producing component to produce first heated air; and
       exhausting the first heated air through a first device top wall perimeter vent that is defined by the first device top wall between the first device perimeter and a first device top wall center portion that is free of venting.

16. The method of claim 15, further comprising:
    transferring heat generated by the first heat producing component to the first device perimeter using a heat transfer device that engages the heat producing component such that the first device perimeter radiates at least some of the heat generated by the first heat producing component, wherein the first heated air is heated using at least some of the heat transferred by the heat transfer device.

17. The method of claim 16, wherein the heat transfer device includes a first heat transfer member that is orientated in an L-shaped configuration, and wherein the first heat transfer member engages the heat producing component.

18. The method of claim 15, wherein the first device includes a plurality of feet that are located on the first device bottom wall and that engage a support surface to provide an air gap, and wherein the perimeter airflow is created by drawing the first fresh air through the air gap.

19. The method of claim 15, wherein the first device is free of a fan system.

20. The method of claim 15, further comprising:
positioning a second device in a stacked orientation with the first device, wherein the second device includes a plurality of feet that engage the first device top wall to provide an air gap is between the first device and the second device in the stacked orientation;
operating a second heat producing component housed between a second device top wall that extends between a second device perimeter, and a second device bottom wall that extends between the second device perimeter and that is located opposite the second device from the second device top wall, wherein the operating of the second heat producing component generates heat;
drawing, in response to operating the second heat producing component to generate heat, the first heated air exhausted from the first device through the first device top wall perimeter vent via the air gap and through a second device bottom wall perimeter vent that is defined by the second device bottom wall between the second device perimeter and a second device bottom wall center portion that is free of venting, wherein the drawing the first heated air through the second device bottom wall perimeter vent results in the first heated air flowing in a second airflow perimeter around the second heat producing component;
heating the first heated air using the heat generated by the second heat producing component to produce second heated air; and
exhausting the second heated air through a second device top wall perimeter vent that is defined by the second device top wall between the second device perimeter and a second device top wall center portion that is free of venting.

* * * * *